United States Patent [19]

Kazerounian et al.

[11] Patent Number: 5,042,009
[45] Date of Patent: Aug. 20, 1991

[54] METHOD FOR PROGRAMMING A FLOATING GATE MEMORY DEVICE

[75] Inventors: Reza Kazerounian, Alameda; Boaz Eitan, Sunnyvale, both of Calif.

[73] Assignee: WaferScale Integration, Inc., Fremont, Calif.

[21] Appl. No.: 282,788

[22] Filed: Dec. 9, 1988

[51] Int. Cl.[5] .............................................. G11C 13/00
[52] U.S. Cl. ................................ 365/185; 365/189.01; 365/230.01
[58] Field of Search ................ 365/185, 189.01, 230.01

[56] References Cited

U.S. PATENT DOCUMENTS

| | | | |
|---|---|---|---|
| 4,580,067 | 4/1986 | Proebsting et al. | 307/296 R |
| 4,628,487 | 12/1986 | Smayling | 365/185 |
| 4,667,312 | 5/1987 | Doung et al. | 365/189 |
| 4,723,225 | 2/1988 | Kaszubinski et al. | 365/185 |
| 4,763,299 | 8/1989 | Hazane | 365/51 |

OTHER PUBLICATIONS

R. Kazerounian, et al., "A 5 Volt Only High Density Poly-Poly Erase Flash Eprom Cell", IEDM. Dec. 1988, pp. 436–439.

*Primary Examiner*—Terrell W. Fears
*Attorney, Agent, or Firm*—Skjerven, Morrill, MacPherson, Franklin & Friel

[57] ABSTRACT

A method of programming a floating gate transistor permits the use of a charge pump to provide drain programming current. The programming drain current is typically held below about 1 $\mu$A. This programming drain current can be provided by a conventional charge pump. In the first embodiment, the drain current can be limited by connecting a resistor between the source and ground. In a second embodiment, the drain current is limited by limiting the transistor control gate voltage. In a third embodiment, a charge pump is coupled to the drain while the control gate is repetitively pulsed. Each time the control gate is pulsed, the transistor turns on, and although the drain is initially discharged through the transistor, some hot electrons are accelerated onto the floating gate, and eventually the floating gate is programmed. In these embodiments the erase gate voltage may be raised to enhance programming efficiency.

30 Claims, 10 Drawing Sheets

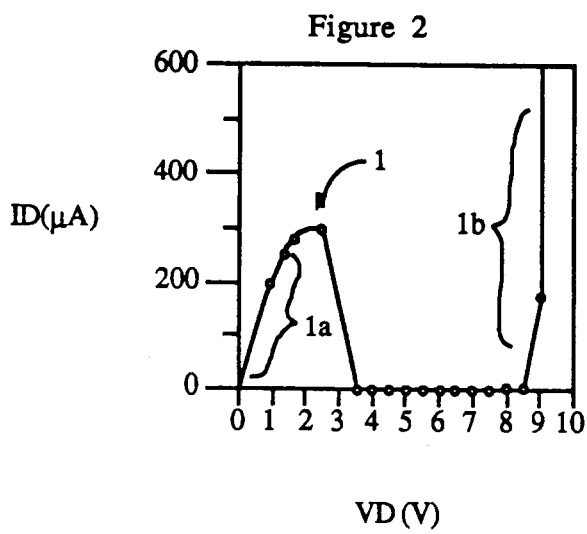
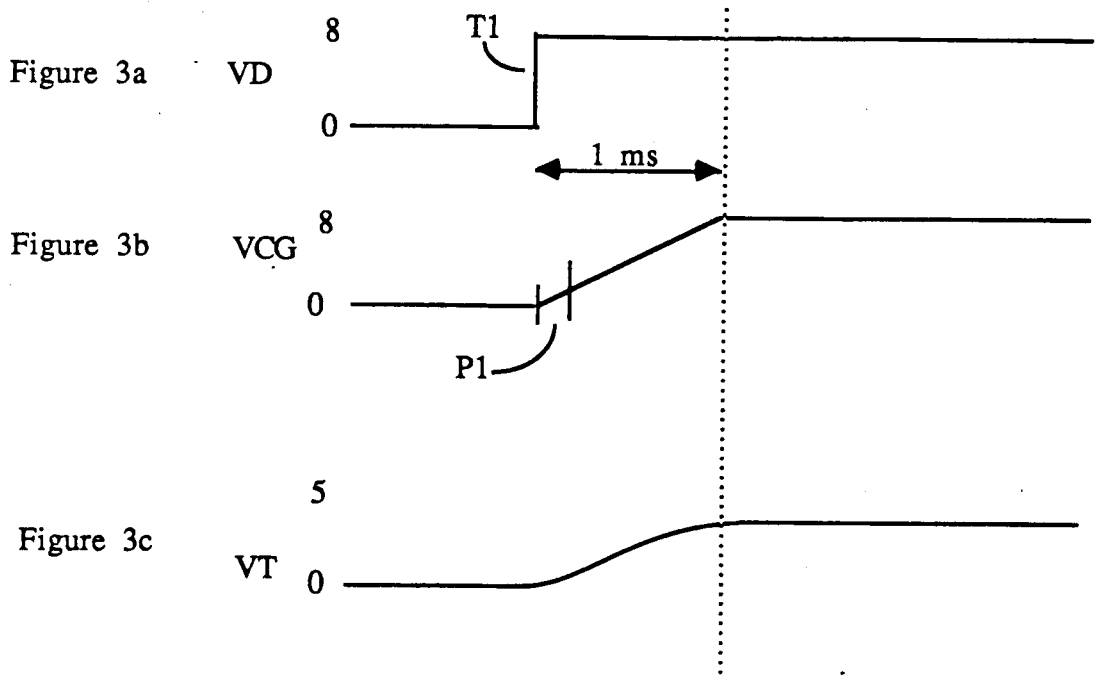

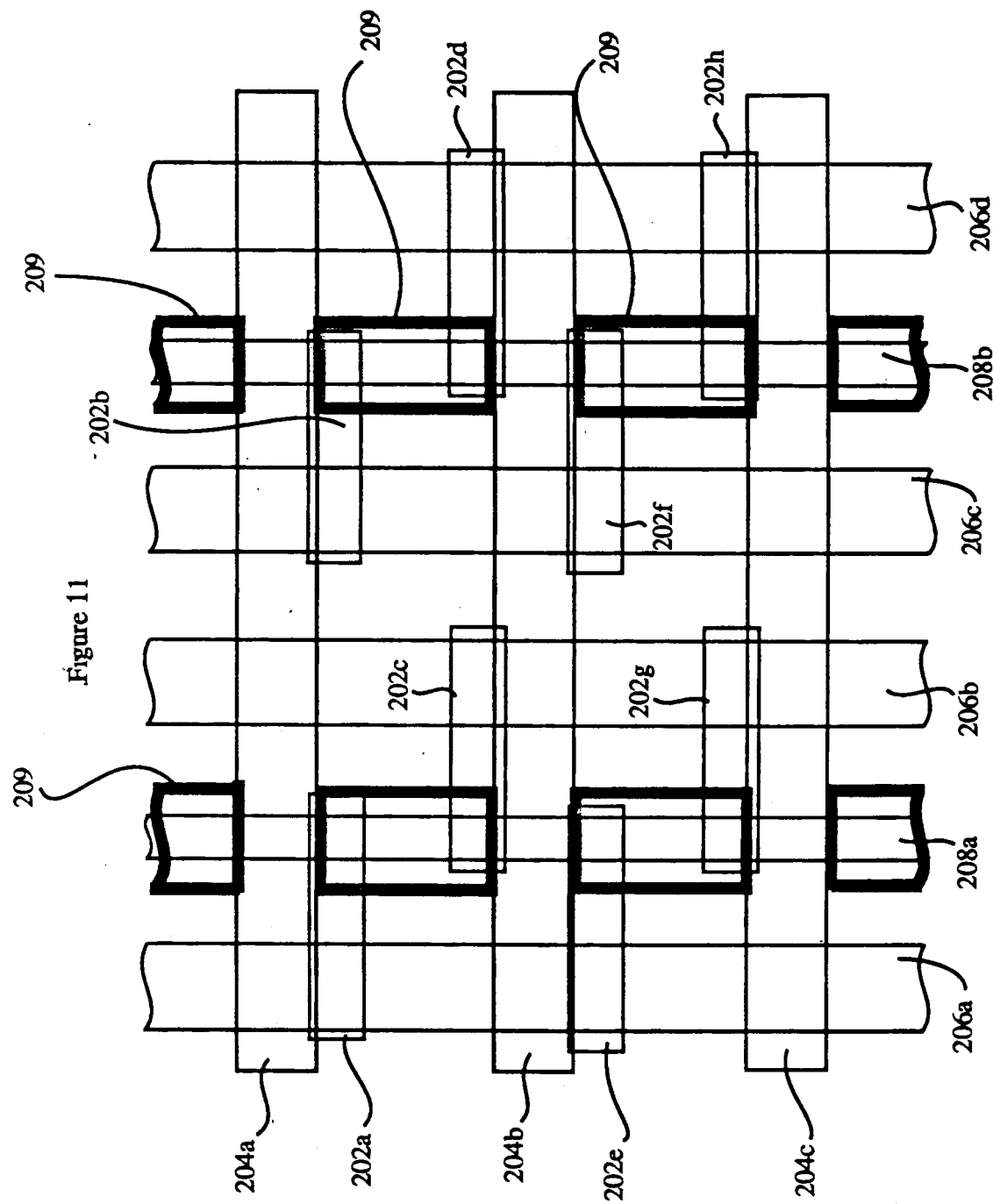

METHOD FOR PROGRAMMING A FLOATING GATE MEMORY DEVICE

BACKGROUND OF THE INVENTION

This invention relates to floating gate memory devices and methods for programming such devices.

There are a number of floating gate memory devices known in the art. One type of floating gate memory comprises an array of floating gate transistors which are programmed and erased by an electron tunneling mechanism. An example of such a device is discussed by Johnson et al. in "A 16 Kb Electrically Erasable Nonvolatile Memory," published at the IEEE International Solid State Circuits Conference in 1980, page 152-153, incorporated herein by reference. Johnson's device uses programming and erase voltages of about 25 volts. Although most digital electronic systems include a 5 volt power supply but do not include a 25 volt power supply, 25 volts can be generated on-chip from a 5 volt power supply with a conventional charge pump, since the amount of current required for tunneling is on the order of 1 nA. Unfortunately, memory cells which are programmed and erased by tunneling tend to be large, and thus expensive.

Another type of floating gate memory is the EPROM, which is programmed by hot electron injection and erased by exposure to UV light. EPROM cells are small, and are less expensive to build than EEPROM cells, but the data stored in the EPROM cannot be reprogrammed unless the EPROM is removed from a system and exposed to UV light prior to reprogramming. Further, such devices are programmed by hot electron injection, which requires a voltage in excess of 5 volts (e.g. about 12 volts) and a high programming current. Such programming currents are too large to generate with a charge pump. Thus, if one wanted to program an EPROM in-system, one would have to include an extra power supply, which would entail an undesirable expense.

Another type of floating gate memory is the flash EPROM, which is programmed by hot electron injection and erased by tunneling. Such a device is discussed by Kynett et al. in "An In-System Reprogrammable 256K CMOS Flash Memory", published at the IEEE International Solid State Circuits Conference in 1988, pages 132 to 133, incorporated herein by reference. Advantageously, flash EPROMs have small memory cells, and are thus relatively inexpensive. However, since flash EPROMs of the type discussed by Kynett are erased by electron tunneling either between the floating gate and drain or between the floating gate and source, they draw a large current during electrical erase due to band to band tunneling across the drain/substrate or source/substrate junction. Flash EPROMs also have a number of other disadvantages. For example, they are hot electron programmed, and thus require a programming voltage in excess of 5 volts (typically 8 to 12 volts) with about 1 mA of programming current per cell. This combination of high current and high programming voltage cannot be economically generated from an on-chip charge pump. (Flash EPROMs cannot be efficiently programmed merely by connecting a 5 volt power supply to the drain, especially at high operating temperatures, e.g. 125° C. Also, since the output voltage of a nominally 5 volt power supply may vary by plus or minus 10%, and thus be as low as 4.5 volts, programming cannot be efficiently accomplished by connecting the 5 volt power supply to the drain for this reason as well.) Another limitation of the above flash EPROM is the need for a tightly regulated erase voltage to prevent over-erase, i.e. to prevent the erase circuitry from leaving the floating gate with a large positive charge. (Since Kynett's floating gate extends from the source to the drain, a positively charged floating gate would leave Kynett's transistor on regardless of the state of his control gate.)

It would be desirable to provide a floating gate memory device which combines the following features:
(1) The small cell size of a flash EPROM;
(2) The erasability of an EEPROM, i.e. a device which can be erased in-system, wherein the erase voltage is generated by a charge pump from a single 5 volt power supply; and
(3) In-system programmability from a single 5 volt power supply.

These goals could be achieved if a method were found for programming a flash EPROM without requiring more than a few microamps of drain current.

SUMMARY

A erasable floating gate memory device constructed in accordance with an embodiment of the invention has the small cell size of a flash EPROM, but can be programmed and erased using a single 5 volt power supply. Of importance, the programming and erase voltages are generated on-chip from the 5 volt power supply, e.g. using a charge pump.

One embodiment of the invention includes means for limiting the amount of current permitted to flow through the drain during programming. Because of this, the programming drain voltage can be generated by a charge pump and it is not necessary to provide an additional power supply for programming the memory device.

In a first embodiment, during programming, the control gate voltage of the floating gate memory device is ramped from a first voltage (e.g. ground) to a programming voltage (e.g. between 5 and 8 volts) over a time period such as 1 millisecond. Because of this, the programming drain current ramps up slowly during the 1 millisecond period, hot electrons are continuously injected onto the floating gate during the 1 millisecond period, the threshold voltage of the transistor is constantly increasing, and there is no period of time during which the drain current exceeds a value greater than that which the charge pump can provide.

In a second embodiment of the invention, during programming, the control gate is raised to a value just slightly greater than the threshold voltage of the transistor while a programming drain voltage is applied to the drain region. This ensures that the drain current through the transistor is of a magnitude which can be provided by a charge pump. The memory device typically incorporates a split gate architecture, i.e. the floating gate covers a first portion of the channel but not a second portion. The control gate covers the second portion of the channel and part of the floating gate. Thus, the control gate controls the amount of current permitted to flow through the channel, even if the floating gate is positively charged.

In this embodiment, the memory device includes an erase gate which is capacitively coupled to the floating gate. During programming, the erase gate voltage is raised, e.g. to about 10 volts, to thereby increase the electrical potential at the floating gate in order to enhance the programming efficiency of the memory device. It is thus seen that the control gate is used to control the amount of programming current, while the erase gate enhances programming efficiency.

In another embodiment of the invention, during programming, the source is coupled to ground via a current limiting element. The current limiting element limits the source current to a value between 1 and 5 µA. An example of such an element is a 1 megaohm resistor. This raises the source voltage during programming, thereby increasing the threshold voltage of the transistor due to the back bias effect, thus reducing the amount of drain current permitted to flow during programming. Because of this increase in threshold voltage, the programming current permitted to flow between the source and drain is limited to a value which can be generated by the charge pump. In this embodiment, in addition to coupling a current limiting element between the source and ground, the transistor erase gate voltage is raised, e.g. to about 10 volts. Since the floating gate is capacitively coupled to the erase gate, this has the effect of increasing the floating gate voltage and enhancing programming efficiency. However, in other embodiments, the erase gate is grounded during programming.

In yet another embodiment, the charge pump is coupled to the transistor drain region while the control gate is periodically pulsed. When the control gate voltage is low, the drain voltage rises to about 8 volts. When the control gate is pulsed, the drain is discharged through the floating gate transistor, and when the control gate voltage is low again, the drain region is permitted to charge to 8 volts. As described in greater detail below, repeatedly pulsing the control gate permits one to program the floating gate transistor with a charge pump, even though the charge pump cannot provide more than a few microamps of current. This programming technique can be used while raising the erase gate voltage to enhance programming efficiency or in conjunction with a grounded erase gate.

In one embodiment, the memory device comprises a staggered virtual ground array of split gate floating gate memory cells. The array comprises a set of elongated source/drain regions and a plurality of rows of floating gates, each row of floating gates formed between a pair of source/drain regions. The floating gates are arranged so that in a given row, every other floating gate is adjacent to a first one of the source/drain regions within the pair, and the remaining floating gates within the row are adjacent a second one of the source/drain regions within the pair. Because of this, the array can be constructed in a smaller surface area than would be possible if all of the floating gates in a given row were adjacent the same source/drain region.

In one embodiment, each cell comprises a channel region between a pair of associated source/drain regions. The channel region includes a first portion under the floating gate (and adjacent to one of the source/drain regions within the pair) which is heavily doped, and a second portion adjacent the other source/drain region which is more lightly doped. The first portion of the channel enhances the programming efficiency of the cell, while the low dopant concentration of the second portion of the channel causes the second portion of the channel to exhibit a low threshold voltage. We have discovered a novel method for doping the channel so that the first and second portions of the channel are self-aligned with the edges of the floating gate. This is done by (1) heavily doping the entire channel region, (2) forming the floating gate, and (3) partially counterdoping the portion of the channel that is not under the floating gate, using the floating gate as a mask. This technique improves yields because it is impossible to misalign the first and second portions of the channel with respect to the rest of the transistor.

These and other advantages of the present invention are better understood with reference to the detailed description below.

BRIEF DESCRIPTION OF THE DRAWINGS

FIG. 2 illustrates the drain current versus drain voltage characteristic curve of the transistor of FIG. 1 with a constant control gate voltage.

FIGS. 3a to 3c are waveform diagrams illustrating the drain voltage, control gate voltage and threshold voltage during programming of the transistor of FIG. 1.

FIG. 11 illustrates in plan view a flash EPROM array constructed in accordance with our invention.

DETAILED DESCRIPTION

Figure 1:
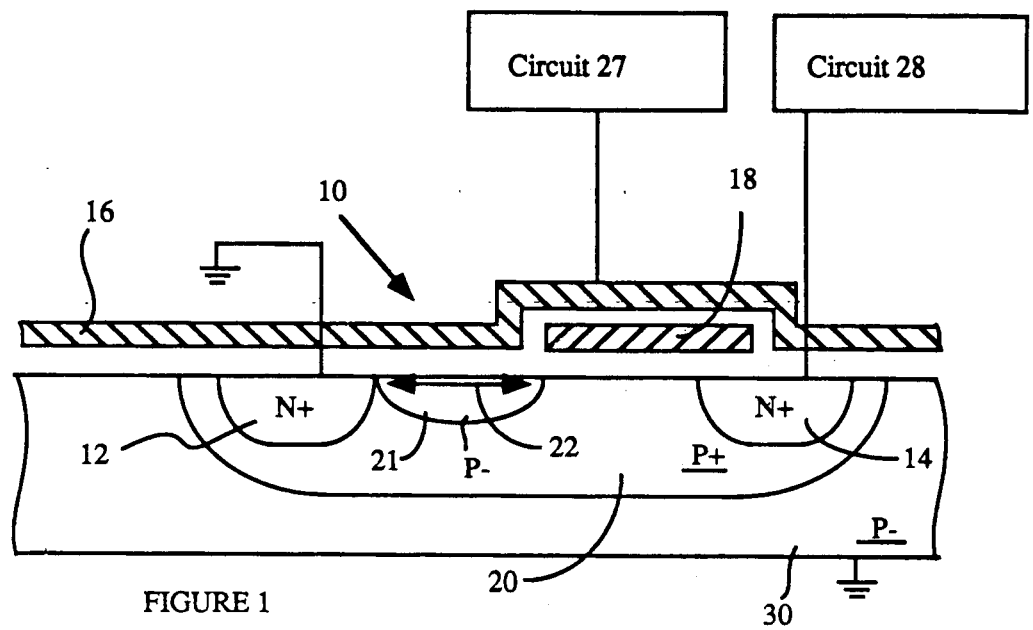
FIG. 1 illustrates a circuit for programming a flash EPROM in accordance with a first embodiment of our invention.
Figure 1A:
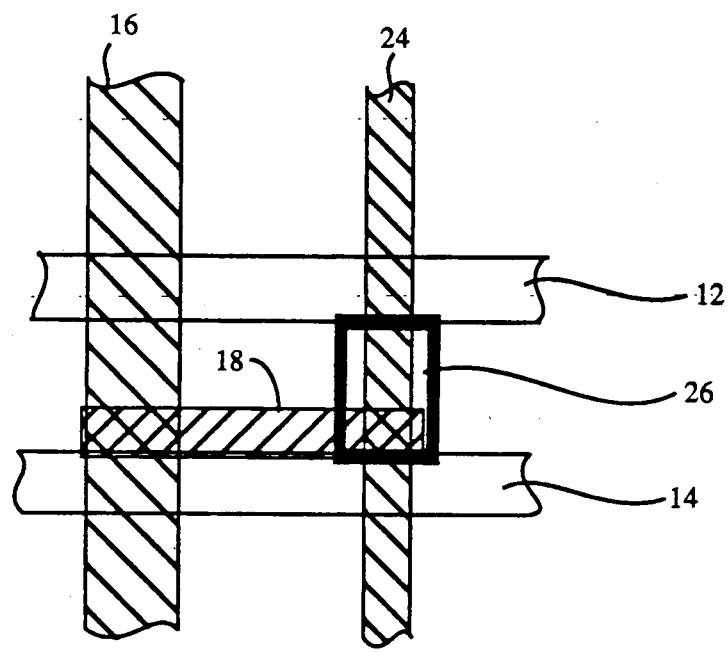
FIG. 1a illustrates in plan view the flash EPROM of FIG. 1.

FIG. 1 illustrates in cross section a flash EPROM transistor 10 coupled to programming circuitry. Referring to FIG. 1, transistor 10 includes an N+source 12, an N+drain 14, a control gate 16 and a floating gate 18. Transistor 10 is formed within a P+region 20 to enhance the programming efficiency of transistor 10. A P−region 21 is formed in a portion 22 of the channel region to reduce the effective threshold voltage of portion 22. Transistor 10 also includes an erase gate 24 which extends over but is insulated from floating gate 18. Erase gate 24 is outside of the cross section of FIG. 1, but is illustrated in plan view in FIG. 1a. The portion of floating gate 18 which extends under erase gate 24 is formed over a field oxide region 26.

If one were to attempt to program transistor 10 by raising the control gate and drain voltages to a programming voltage (e.g., about 8 to 12 volts), the drain current would initially rise to several hundred microamps as the drain voltage increased. The "one-shot" drain current versus drain voltage characteristic curve of transistor 10 is illustrated in FIG. 2. Curve 1 in FIG. 2 indicates that current initially increases (portion 1a), but thereafter drops as floating gate 18 is programmed. If the drain voltage keeps increasing, current rises again (portion 1b) due to injection induced breakdown between drain 14 and P+region 20. A charge pump cannot economically provide the several hundred microamps required to get past portion 1a of curve 1. However, we have discovered a method for programming transistor 10 without providing such a large drain current.

In accordance with one embodiment of our invention, a control gate voltage waveform as illustrated in FIG. 3b is applied to control gate 16 by a circuit 27 while the voltage 12 waveform of FIG. 3a is applied to drain 14 by a circuit 28. As can be seen, at or after a time T1 when a programming drain voltage of about 8 volts is applied to drain 14, the voltage at control gate 16 ramps up from 0 to 8 volts over a time period (typically 0.1 to 10 ms, and preferably 1 ms). During a first portion P1 of this 1 ms period, control gate voltage VCG never exceeds a few volts, and the conditions required to draw a drain current of more than 1 $\mu$A never exist. However, during portion P1, electrons are slowly injected onto floating gate 18, and threshold voltage VT slowly starts to rise (FIG. 3c).

After portion P1, control gate voltage VCG continues to increase to 8 volts. However, transistor 10 still does not draw more than 1 $\mu$A because threshold voltage VT also continues to increase, and conditions are never created which would permit a large drain current to flow. By the time voltage VCG reaches 8 volts, threshold voltage VT reaches about 8 volts, and transistor 10 is programmed without ever requiring more than 1 $\mu$A of drain current.

It will be apparent to those skilled in the art how to build circuits 27 and 28 capable of generating the voltage waveforms of FIGS. 3a and 3b. Thus circuits 27 and 28 will not be described in further detail herein except to note that the voltage applied to control gate 16 and drain 14 by circuits 27, 28 is derived from a charge pump. Although 8 volts are applied to the transistor of FIG. 1, this value is merely exemplary, and other voltages can also be applied to transistor 10.

Transistor 10 is read in a conventional manner, e.g., by raising the voltage at control gate 16 to about 5 volts, raising the voltage at drain 14 to 1.5 volts, grounding source 12 and erase gate 24, and sensing whether current flows through transistor 10. Transistor 10 is erased by grounding control gate 16, drain 14 and source 12 and raising the erase gate voltage to about 25 volts, thereby causing electrons to tunnel from floating gate 18 to erase gate 24. This leaves floating gate 18 positively charged.

Although the embodiment discussed above functions adequately and comes within the scope of the invention, it does have some drawbacks. For example, different transistors in the array may be programmed at different rates. Assume, for example, that hot electrons reach the floating gate of one of the transistors in the array at a low rate. If the control gate voltage of that transistor increases too rapidly, the transistor will start to draw a large current (e.g. in excess of 100 $\mu$A) before charge is injected into its floating gate. Thus, the drain voltage $V_D$ will start to drop, and programming will cease. Accordingly, the ramp rate must be selected to rise as slowly as the programming rate of the slowest transistor in the array allows. (If the ramp rate is too slow, programming will take too long.)

Figure 4:
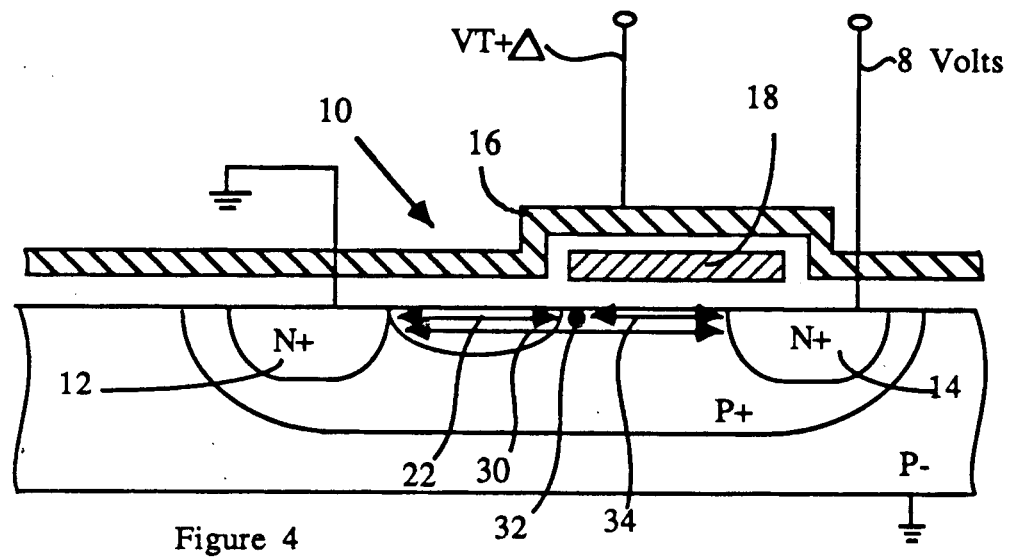
FIG. 4 illustrates a floating gate transistor which is programmed using a method in accordance with a second embodiment of our invention.

FIG. 4 illustrates another embodiment of my invention. In FIG. 4, during programming a voltage of about 8 volts is applied to drain 14 while a voltage $V_T+\Delta$ is applied to control gate 16, where $V_T$ is the threshold voltage which, if applied to control gate 16, will permit up to 1 $\mu$A to flow through portion 22 of transistor channel 30. $\Delta$ is an incremental voltage, such that if $V_T+\Delta$ is applied to control gate 16, several microamps will be permitted to flow through portion 22. ($V_T$ is typically about 1.0 volt, while $\Delta$ is about 0.2 volts.) It is thus seen that as long as the control gate voltage is less than or equal to $V_T+\Delta$, the drain current will be less than several microamps, and thus the transistor of FIG. 4 can be programmed using a conventional charge pump.

As is known in the art, the higher the electrical potential at floating gate 18, the greater the programming efficiency of transistor 10. In one embodiment, the electrical potential of floating gate 18 is enhanced by raising the voltage at erase gate 24. Because of capacitive coupling between erase gate 24 and floating gate 18, the increase in erase gate voltage, e.g. to about 10 volts, enhances programming of transistor 10. Of course, the erase gate voltage cannot be raised too high, e.g., greater than 20 volts, or electrons will tunnel off of floating gate 18 and onto erase gate 24.

Figure 4A:
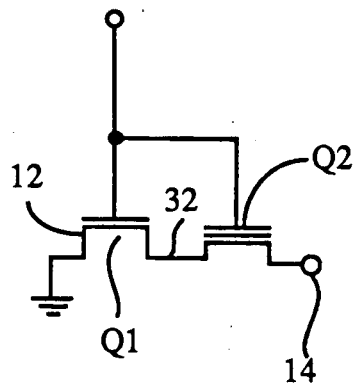
FIG. 4a schematically illustrates a circuit equivalent to that shown in FIG. 4.
Figure 5:
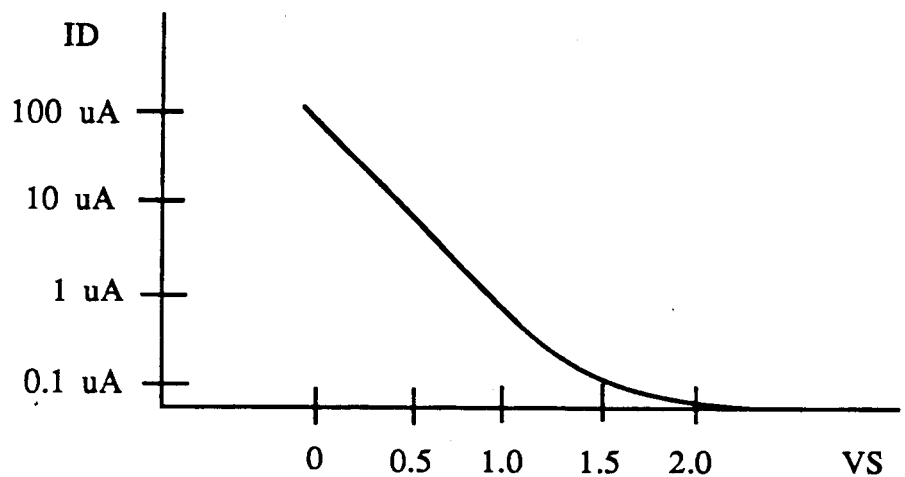
FIG. 5 illustrates the effect of a source bias voltage on drain current.

It should be noted that although control gate 16 is biased such that portion 22 of channel 30 limits current below a few microamps, the voltage drop across portion 22 is only between 2 and 3 volts, even when 8 volts are applied to drain 14. The reason for this is that transistor 10 can be envisioned as two transistors, i.e. a first transistor Q1 (FIG. 4a) whose source is source 12, whose channel is channel portion 22, and whose drain is point 32 between channel portions 22 and 34. The drain, channel and source of the second transistor Q2 comprise drain 14, channel portion 34, and point 32, respectively. As point 32 is biased with respect to P+region 20, the back bias effect (also known as the body effect) of second transistor Q2 increases the effective threshold voltage of the second transistor, thus ensuring a large voltage drop between drain 14 and point 32. (The relation between the source-substrate voltage and drain current for a transistor is illustrated in FIG. 5). It is this voltage drop which accelerates hot electrons onto floating gate 18. The enhanced dopant concentration at P+region 20 increases the back bias effect exhibited by second transistor Q2. (The back bias effect is discussed at pages 32 to 43 of "MOS Field-Effect Transistors and Integrated Circuits" by Paul Richman, published by John Wiley and Sons in 1973, incorporated herein by reference.) It is thus seen that the transistor of FIG. 4 is programmed without requiring a large drain current.

Although the embodiment of FIG. 4 functions adequately and comes within the scope of the present invention, it too has several drawbacks. For example, because dopant concentrations, oxide thicknesses and other parameters vary over the wafer surface area, the threshold voltages of the various transistors in the array may vary, and it may be difficult to generate a control gate voltage $V_T+\Delta$ which will permit programming of the various flash EPROM transistors at an acceptable rate without permitting too much drain current to flow, and thus cause the drain voltage to drop.

In another embodiment, instead of applying about 8 volts to drain 14 and $V_T+\Delta$ to control gate 16, a voltage of about 6 volts is applied to drain 14 and a voltage between about 2.5 and 3.5 volts is applied to control gate 16. This will permit a programming drain current between about 50 μA and 100 μA. It is noted that while it is difficult to economically generate 100 μA from a charge pump which generates 8 volts from a 5 volt. 10% supply, 100 μA can be economically generated from a charge pump which generates 6 volts from a 5 volt±10% supply.

Since this embodiment permits between 50 and 100 μA to flow through the transistor, the voltage at point 32 will be lower in this embodiment than in the embodiment in which $V_T+\Delta$ is applied to control gate 16. Since it is the voltage difference between drain 14 and point 32 which provides electrons with enough energy to reach floating gate 18, the smaller drain voltage in this embodiment is offset by the lower voltage at point 32.

It should be noted that in this embodiment, the control gate voltage need not be regulated as tightly as the embodiment in which $V_T+\Delta$ is applied to control gate 16. Also, in this embodiment, the erase gate voltage is raised, e.g. to a voltage generally less than 15 volts and preferably about 10 volts.

Figure 6:
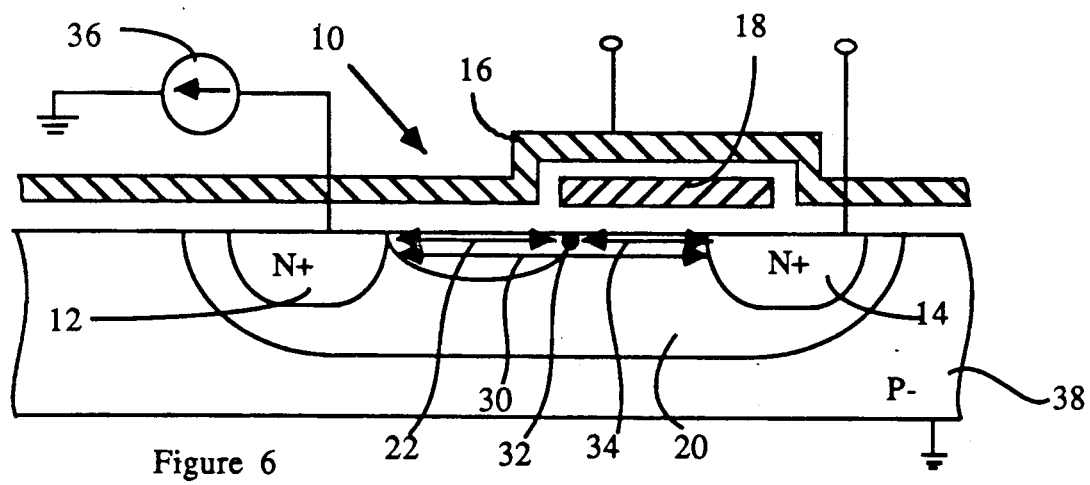
FIG. 6 illustrates a floating gate transistor in which the source is biased with respect to the substrate during programming by a current limiting circuit element.

FIG. 6 illustrates another embodiment of our invention in which programming drain current is held below 1 μA automatically without requiring the generation of a control gate voltage within very tight constraints. Referring to FIG. 6, 8 volts are applied to drain 14, about 4 volts are applied to control gate 16, and a current limiter 36 is coupled between source 12 and ground during programming. (During reading and erasing, source 12 is connected directly to ground.) Current limiter 36 is typically a 1 MΩ resistor which limits the amount of current permitted to flow through transistor 10. As current flows through transistor 10, current limiter 36 has the effect of biasing source 12 relative to substrate 38 to generate the above-mentioned back bias effect by virtue of the ohmic voltage drop across the resistor. As the voltage at source 12 reaches about one volt, the back bias effect of first transistor Q1 causes the programming current to drop to about 1 μA. This causes the voltage at point 32 to rise, e.g. to a value between 2 and 3 volts, thereby increasing the back bias effect of transistor Q2. Because of this, transistor Q2 limits the drain current flowing through drain 14, thereby ensuring that point 32 is at a voltage such that the voltage drop between drain 14 and point 32 is sufficient to accelerate hot electrons onto floating gate 18. (Because of the enhanced dopant concentration of channel portion 34, the drain current of transistor Q2 is more sensitive to its source voltage than transistor Q1. P+region 20 is grounded via its electrical connection to grounded substrate 38.)

As electrons are accelerated onto floating gate 18, the threshold voltage of transistor Q2 starts to increase, and the voltage at point 32 starts to decrease, so that the voltage across the source and drain of transistor Q2 increases. This increase in voltage facilitates further injection of hot electrons onto floating gate 18.

As in the embodiment described above in relation to FIG. 4, the erase gate voltage is typically raised during programming, e.g. to about 10 volts, to enhance programming efficiency.

After electrical erase, floating gate 18 is typically positively charged. This positive charge also effectively raises the floating gate electrical potential to further enhance programming efficiency.

Figure 6A:
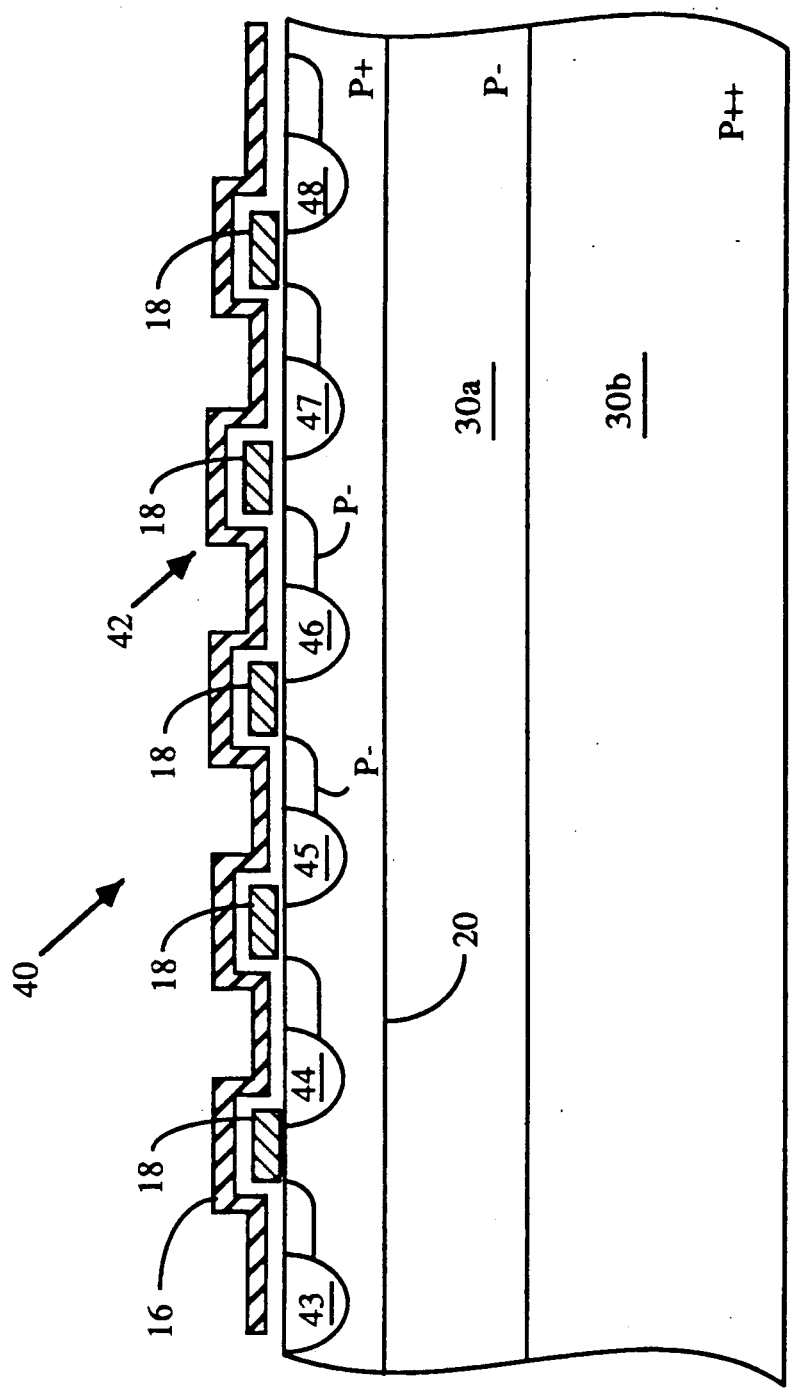
FIG. 6a illustrates a row of transistors constructed in accordance with the embodiment of FIG. 6.

As mentioned above, only about 4 volts are applied to control gate 16 during programming. The reason for this is that a transistor in accordance with the embodiment of FIG. 6 is typically part of a row of transistors such as row 40 of FIG. 6a. This row comprises a plurality of source/drain regions 43 to 48, and the junction between each source/drain region and P+region 20 forms a capacitor. If it were desired to program a transistor 42 in row 40 and control gate 16 were raised to a voltage in excess of 6 volts, and all of floating gates 18 in row 40 were positively charged, all of source/drain regions 43 to 45 would be effectively connected to source/drain region 46 (source/drain 46 serves as the source of transistor 42). That would be the equivalent of connecting a very large parasitic capacitance to source/drain region 46, and it would take an unacceptably long amount of time to raise the voltage at region 46 and to program transistor 42. By only raising the control gate voltage to only 4 volts, a resistance between source/drain region 46 and the other source/drain regions to the left of transistor 42 is created to reduce the effect of the above-mentioned parasitic capacitance. (In the embodiment of FIG. 6a, P− region 30a can be an epitaxial layer on a P++substrate 30b.)

Figure 12:
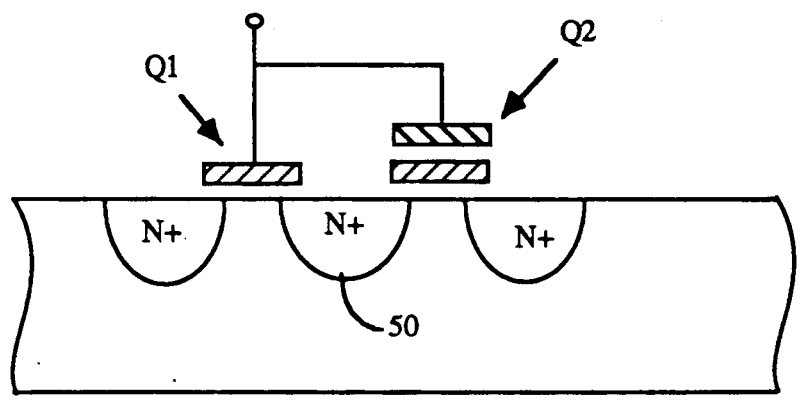
FIG. 12 illustrates a floating gate transistor coupled to a single gate transistor.

Transistor 10 of FIG. 6 is a split gate flash EPROM, meaning that floating gate 18 covers portion 34 of channel 30 but not portion 22. As mentioned above, this is the equivalent of the pair of transistors Q1, Q2 in FIG. 4a. However, split gate transistor 10 has two advantages over an embodiment in which the EPROM cell was actually constructed as two transistors (FIG. 12). First, the transistor of FIG. 6 (and FIGS. 1 and 4) is smaller than transistors Q1 and Q2 of FIG. 12. Second, in FIG. 6, electrons gain energy while travelling from source 12 to point 32, and for at least some of these electrons, this energy can be added to the energy gained by the electrons as they travel through channel portion 34, to enhance programming efficiency. In the embodiment of FIG. 12, any energy gained by electrons moving through the channel of transistor Q1 is completely lost as the electrons move through N+region 50, and this lost energy cannot be used to enhance programming efficiency.

One of the major advantages of the transistor of FIG. 6 is the fact that the transistor is programmed (1) without drawing more than a few microamps of drain current, and (2) without requiring precise regulation of control gate, erase gate or drain voltages. As mentioned above, in the embodiment in which a ramp voltage is applied to the control gate and the embodiment in which $V_T+\Delta$ is applied to the control gate, the control gate voltage has to be precisely controlled to permit programming without drawing too much drain current. In FIG. 6, programming is achieved without having to tightly regulate the control gate voltage.

Figure 7:
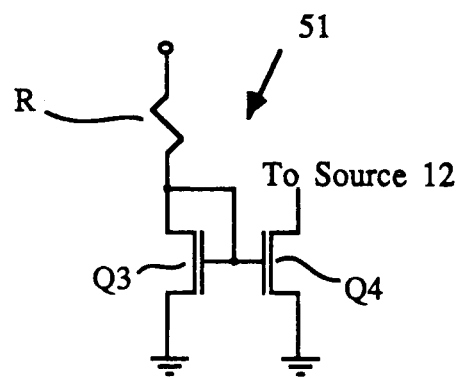
FIG. 7 illustrates a circuit which provides an MOS transistor equivalent of a resistor which is used as the current limiting circuit element of FIG. 6.

Instead of using a resistor as current limiter 36, in one embodiment, a circuit 51, comprising a first MOSFET Q3 and a second MOSFET Q4, coupled in a current mirror configuration, provides an MOS equivalent of a resistor (FIG. 7). A resister R is coupled between VCC and the drain of transistor Q3. The effective resistance $R_{EQ}$ between the source and drain of transistor Q4 is as follows:

$$R_{EQ} = R_1 \times (W3/L3)/(W4/L4)$$

where W3, L3, W4 and L4 are the channel width of transistor Q3, the channel length of transistor Q3, the channel width of transistor Q4 and the channel length of transistor Q4, respectively, and R1 is the resistance of resistor R. W3, L3, W4 and L4 are selected so that transistor Q4 exhibits a desired amount of resistance. This effective resistance $R_{EQ}$ is typically within the range of 100 KΩ to 2 MΩ, and preferably about 1 MΩ, to permit a drain current less than about 10 μA to flow through floating gate transistor 10.

Figure 8:
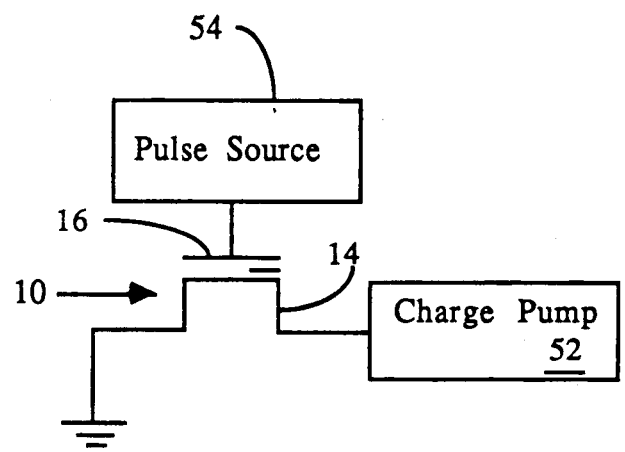
FIG. 8 illustrates a transistor, the drain of which is coupled directly to a charge pump and the control gate of which is coupled to a pulse source.
Figure 9A:
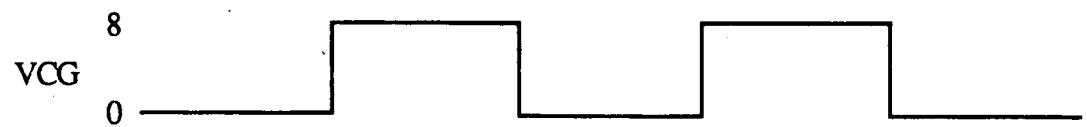
FIGS. 9a and 9b illustrate the control gate and drain voltage waveform applied to the floating gate transistor of FIG. 8.
Figure 9B:
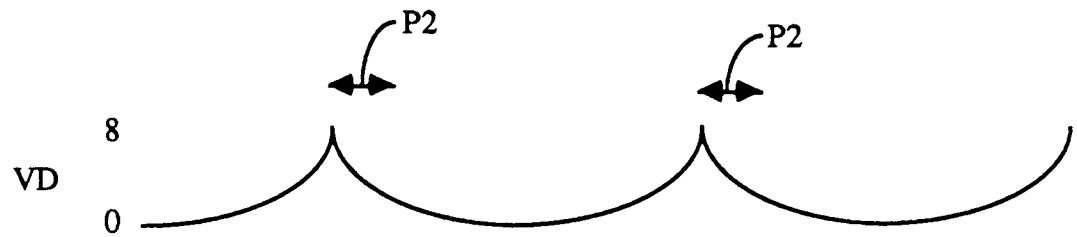

In accordance with another embodiment of our invention, drain 14 is coupled to a charge pump 52 while control gate 6 is coupled to a pulse source 54 (FIG. 8). Pulse source 54 provides a stream of pulses having an amplitude of about 5 volts (VCC), an on-time of 0.1 microseconds and an off-time of 0.9 microseconds. (The waveform provided by pulse source 54 is illustrated in FIG. 9a.) Of importance, when control gate 16 is at ground, transistor 10 is off, and drain 14 charges to about 8 volts. When control gate 16 is pulsed, drain 14 is discharged through transistor 10, and when control gate 16 is again grounded, drain 14 charges back to about 8 volts. FIG. 9b illustrates the drain voltage waveform resulting from coupling charge pump 52 to drain 14 and pulsing control gate 16. The repetitive application of the waveform of FIGS. 9a and 9b to control gate 16 and drain 14 over about a 1 ms time period is sufficient to program transistor 10, because at least during time periods P2, the voltage conditions are appropriate for accelerating hot electrons onto floating gate 18. (If control gate 16 were not pulsed, drain 14 would remain at a low voltage because the charge pump coupled to drain 14 cannot provide a large output current, and the conditions required for hot electron injection would not exist.)

A novel technique for constructing a flash EPROM transistor 101 (FIG. 10d) for use with the above described programming technique is described below.

Figure 10A:
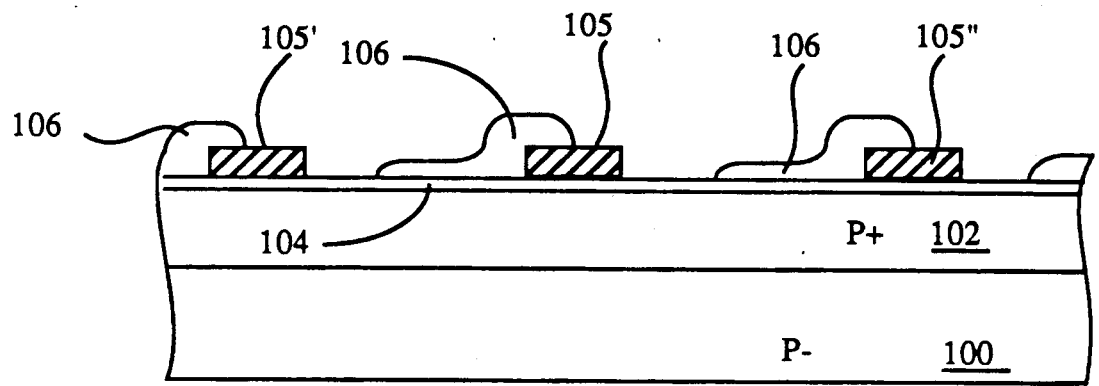
FIGS. 10a to 10d illustrate a floating gate transistor during a manufacturing process in accordance with our invention.

First, a P− silicon substrate 100 is implanted with P type impurities to form a P+layer 102 approximately 0.8 microns thick and having a dopant concentration of between $10^{17}$ and $10^{18}/cm^3$ (FIG. 10a). An insulating layer 104 (typically thermally grown SiO$_2$) is formed on the wafer, and a heavily doped polysilicon floating gate 105 is formed on insulating layer 104 in a conventional manner. (During formation of floating gate 105, other floating gates such as floating gates 105' and 105" are formed elsewhere on the surface. The description herein only refers to structures within transistor 101, it being understood that similar structures constituting the rest of a flash EPROM array are formed elsewhere on the wafer.) A photoresist layer 106 is then formed on the wafer and patterned.

Figure 10B:
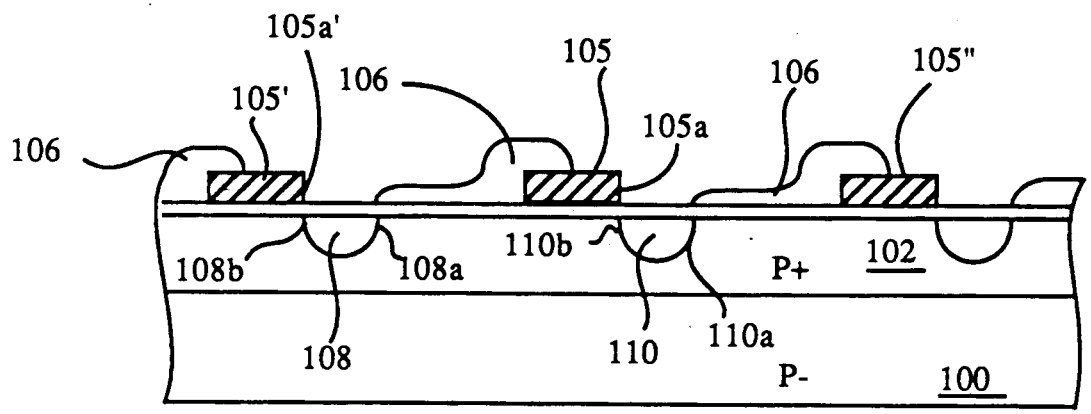

Referring to FIG. 10b, the wafer is then subjected to an N type ion implantation step to form N+source 108 and drain 110. One edge 108a of source 108 and one edge 110a of drain 110 are defined by photoresist 106, while the other edge 108b of source 108 and edge 110b of drain 110 are defined by edges 105a' and 105a of floating gates 105' and 105, respectively. This is done for reasons described in U.S. Pat. No. 4,639,893, issued to Boaz Eitan, and incorporated herein by reference.

Figure 10C:
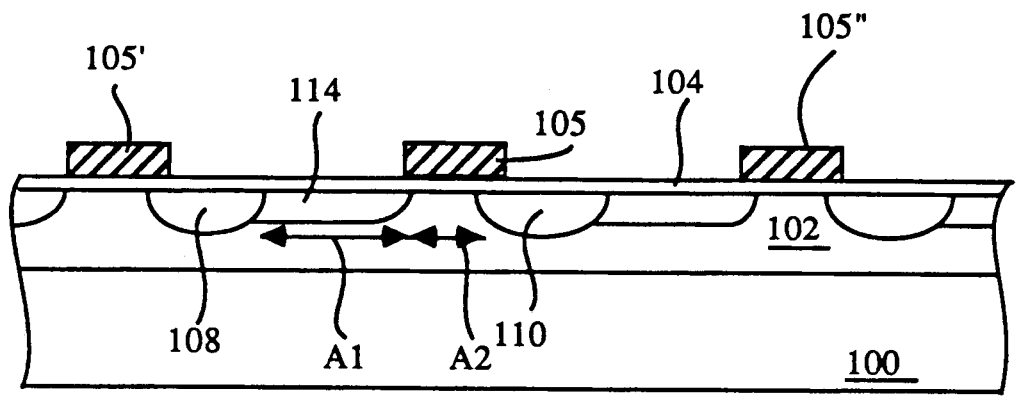
Figure 10D:
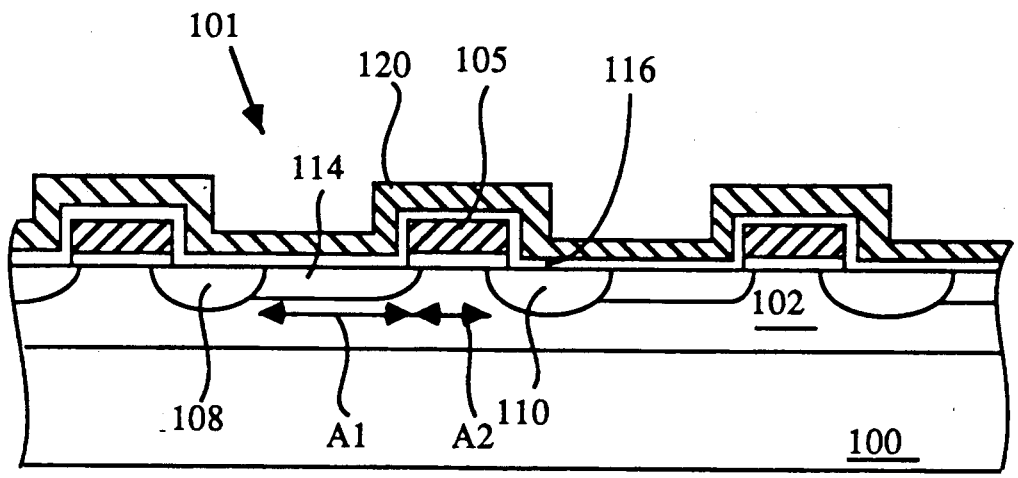

Photoresist layer 106 is removed, and the wafer is subjected to a diffusion step. The wafer is then subjected to a blanket N type ion implantation step to partially counter-dope a portion 114 of P+layer 102, so that portion 114 becomes P− material (see FIG. 10c). It will be appreciated that at the conclusion of this process step, the transistor channel will include a first area A1 which comprises P− material and a second area A2 which comprises P+material. P+area A2 serves to enhance the transistor programming efficiency, while area A1 is P- material so that the effective threshold voltage of area A1 is about one volt. Of importance, the lateral extent of areas A1 and A2 are self-aligned with the other transistor structures. Thus, it is impossible to misalign the lateral extent of areas A1, A2 and degrade manufacturing yields.

The wafer is then subjected to an oxide etching step (e.g. using HF acid) to remove the exposed portions of insulating layer 104. An additional insulation layer 116 is then formed on the wafer (e.g. by thermal oxidation). Transistor 101 is completed by forming control gate 120 on the wafer using conventional techniques. (See FIG. 10d).

The threshold voltage of area A2 when floating gate 105 is electrically neutral is approximately 3 to 5 volts because of the enhanced channel doping concentration. However, transistor 101 is a flash EPROM. Prior to use, charge is removed from floating gate 105 with an erase gate (not shown in FIGS. 10a to 10d, but described below) prior to use. This reduces the threshold voltage of area A2 below zero volts. (Although this may result in an inversion region forming under floating gate 105 independently of the voltage at control gate 120, this will not create a problem since area A1 will only conduct when a high voltage is applied to control gate 120.) Under these circumstances, transistor 101 stores a zero. Floating gate 105 can then be programmed to raise the threshold voltage of area A2 and to thereby store a one in transistor 101.

During the process of constructing control gate 120, an erase gate (not shown in FIGS. 10a to 10d) is also formed over floating gate 105, typically outside of the cross section of FIGS. 10a to 10d. The resulting cell may have a layout as illustrated and described in U.S. Pat. application Ser. No. 07/189,874, entitled "EEPROM WITH IMPROVED ERASE STRUCTURE" filed by Eitan et al. on May 3, 1988, incorporated herein by reference. FIG. 11 illustrates a portion of the layout of an array 200 of flash EPROM cells constructed in accordance with an alternative embodiment of the invention. As can be seen, array 200 includes an array of floating gates 202a to 202h, source/drain regions 204a to 204c, control gates 206a to 206d, tunneling erase gates 208a, 208b, and field oxide regions 209. Array 200 is constructed using a staggered virtual grounded architecture. When it is desired to read or program floating gates 202a or 202b, source/drain region 204a serves as a drain while source/drain region 204b serves as a source. When it is desired to read or program floating gates 202c or 202d, source/drain region 204b serves as a drain while source/drain region 204a serves as a source. Source/drain regions 204b, 204c similarly serve as a source or a drain to read or program one of floating gates 202e to 202h. Control gate 206a is used to read or program the floating gates within the column comprising floating gates 202a and 202e. The other control gates are used to read or program the floating gates within other associated columns of floating gates. Erase gate 208a is used to erase floating gates 202a, 202c, 202e and 202g, while erase gate 208b is used to erase floating gates 202b, 202d, 202f and 202h.

In the array of FIG. 11, the floating gates are staggered relative to one another, i.e. the floating gates 202a is formed against source/drain region 204a while adjacent floating gate 202c is formed against source/drain region 202b. If floating gates 202a and 202c were both formed against source/drain region 204a, the cell size would have to be increased to permit both floating gates 202a and 202c to extend underneath erase gate 208a. Thus, staggering the floating gates permits the flash EPROM array to be constructed on a small surface area.

An address decoder appropriate for use with the array of FIG. 11 is discussed in U.S. patent application Ser. No. 07/258,926, filed on Oct. 17, 1988 by Syed Ali and incorporated herein by reference. Also see U.S. patent application Ser. No. 07/258,952, filed by Eitan et al. on Oct. 17, 1988.

While the invention has been described with regard to specific embodiments, those skilled in the art will recognize that changes can be made in form and detail without departing from the spirit and scope of the invention. Accordingly, all such changes come within the present invention.

I claim:

1. A method for programming a floating gate transistor, said floating gate transistor comprising a source, a drain spaced apart from said source, said source and drain being of a first conductivity type and formed in a semiconductor region of a second conductivity type, a channel extending between said source and drain, a floating gate extending over at least a portion of said channel, and a control gate extending over at least a portion of said floating gate, said method comprising the steps of:
applying a programming voltage to said drain and control gate sufficient to cause hot electron injection programming of said transistor; and
ensuring that the programming drain current for said transistor is less than a predetermined value.

2. Method of claim 1 wherein said predetermined value is less than or equal to about 150 $\mu$A.

3. Method of claim 1 wherein said predetermined value is less than or equal to about 10 $\mu$A.

4. Method of claim 1 wherein said programming drain voltage is provided by a charge pump and said programming drain current is held to a value sufficiently low so that said charge pump can provide said programming drain current.

5. A method for programming a floating gate transistor, said floating gate transistor comprising a source, a drain spaced apart from said source, said source and drain being of a first conductivity type and formed in a semiconductor region of a second conductivity type, a channel extending between said source and drain, a floating gate extending over at least a portion of said channel, and a control gate extending over at least a portion of said floating gate, said method comprising the steps of:
applying a programming voltage to said drain; and
applying to said control gate a voltage which rises from a first value to a second value such that during the time said voltage at said control gate is rising, electrons are being injected into said floating gate so that the threshold voltage of said transistor increases at a rate which ensures that said transistor does not draw a drain current over a predetermined value during programming.

6. Method of claim 5 wherein the voltage applied to said control gate rises from said first value to said second value over a 0.1 ms time period.

7. Method of claim 1 wherein said step of ensuring comprises the step of applying a voltage to said control gate to keep the drain current below said predetermined value.

8. Method of claim 7 wherein said transistor comprises an erase gate capacitively coupled to said floating gate, said method further comprising the step of raising the voltage at said erase gate.

9. A method for programming a floating gate transistor, said floating gate transistor comprising a source, a drain spaced apart from said source, said source and drain being of a first conductivity type and formed in a semiconductor region of a second conductivity type, a channel extending between said source and drain, a floating gate extending over at least a portion of said channel, and a control gate extending over at least a portion of said floating gate, said method comprising the steps of:
applying a programming voltage to said drain and control gate;
ensuring that the programming drain current is less than a predetermined value, wherein said step of ensuring comprises the step of providing an electrical resistance between said source and ground, said semiconductor region being grounded.

10. Method of claim 9 wherein said transistor comprises an erase gate capacitively coupled to said floating gate, said method further comprising the step of raising the voltage at said erase gate.

11. Method of claim 10 wherein the voltage at said erase gate is greater than 5 volts during programming.

12. Method of claim 10 wherein the voltage at said erase gate is less than 20 volts during programming.

13. Method of claim 9 wherein said transistor comprises an erase gate which is grounded during programming.

14. A method for programming a floating gate transistor, said transistor comprising a source, a drain, a channel extending between said source and drain, a floating gate extending over at least a portion of said channel, and a control gate extending over at least a portion of said floating gate, said method comprising the steps of:
coupling a programming voltage generator to said drain; and
repetitively applying pulses to said control gate to thereby cause hot electron injection programming of said transistor.

15. Method of claim 14 wherein said programming voltage generator is a charge pump.

16. Method of claim 14 wherein said transistor comprises an erase gate capacitively coupled to said floating gate, said method further comprising the step of raising the voltage at said erase gate.

17. Method of claim 14 wherein said transistor comprises an erase gate which is grounded during programming.

18. A method for programming a floating gate transistor, said transistor comprising a source, a drain, a channel extending between said source and drain, a floating gate extending over at least a portion of said channel, and a control gate extending over at least a portion of said floating gate, said method comprising the steps of:
- coupling a programming voltage generator to said drain; and
- repetitively applying pulses to said control gate,
- wherein said programming voltage generator is incapable of generating an output current which said transistor would normally conduct if (1) said floating gate were unprogrammed, (2) said programming drain voltage was applied to said drain, and (3) a programming control gate voltage equal to the amplitude of said pulses was applied to said control gate.

19. Structure comprising:
- a floating transistor including a source, a drain spaced apart from said source, said source and drain being of a first conductivity type and formed in a semiconductor region of a second conductivity type, a channel extending between said source and drain, a floating gate extending over at least a portion of said channel, and a control gate extending over at least a portion of said floating gate; and
- means for applying a programming voltage to said drain and control gate to thereby program said transistor by hot electron injection and ensuring that the programming drain current of said transistor is less than a predetermined value.

20. Structure of claim 19 wherein said predetermined value is less than or equal to about 150 μA.

21. Structure comprising:
- a floating gate transistor including a source, a drain spaced apart from said source, said source and drain being of a first conductivity type and formed in a semiconductor region of a second conductivity type, a channel extending between said source and drain, a floating gate extending over at least a portion of said channel, and control gate extending over at least a portion of said floating gate; and
- means for applying a programming voltage to said drain and control gate and ensuring that the programming drain current is less than a predetermined value, wherein said means for applying applies to said control gate a voltage which rises from a first value to a second value such that during the time said voltage at said control gate is rising, electrons are being injected into said floating gate so that the threshold voltage of said transistor increases at a rate which ensures that said transistor does not draw a drain current over said predetermined value during programming.

22. Structure of claim 21 wherein said means for applying causes the voltage at said control gate to rise from said first value to said second value over a 0.1 ms time period.

23. Structure of claim 19 wherein an electrical resistance is provided between said source and ground to prevent said programming drain current from exceeding said predetermined value, said semiconductor region being grounded.

24. Structure of claim 23 wherein said transistor comprises an erase gate capacitively coupled to said floating gate, and said means for applying also raises the voltage at said erase gate during programming.

25. Structure comprising:
- a floating gate transistor including a source, a drain, a channel extending between said source and drain, a floating gate extending over at least a portion of said channel, and a control gate extending over at least a portion of said floating gate; and
- means for repetitively applying pulses to said control gate to thereby program said floating gate transistor by hot electron injection.

26. Structure of claim 25 wherein said transistor includes an erase gate capacitively coupled to said floating gate, said structure further comprising means for raising the voltage at said erase gate during programming.

27. Method of claim 1 wherein said step of ensuring comprises the step of coupling the source of said floating gate transistor to an additional transistor, said additional transistor limiting the current of said floating gate transistor during programming.

28. Method of claim 1 wherein said step of ensuring comprises the step of raising the source voltage of said floating gate transistor during programming.

29. Structure of claim 19 further comprising means for increasing the voltage at said source during programming.

30. Structure of claim 19 further comprising an additional transistor coupled to the source of said floating gate transistor, said additional transistor limiting the programming current of said floating gate transistor.

* * * * *